United States Patent [19]
Krivokapic

[11] Patent Number: 5,963,824
[45] Date of Patent: Oct. 5, 1999

[54] METHOD OF MAKING A SEMICONDUCTOR DEVICE WITH ADJUSTABLE THRESHOLD VOLTAGE

[75] Inventor: Zoran Krivokapic, Santa Clara, Calif.

[73] Assignee: Advanced Micro Devices, Inc., Sunnyvale, Calif.

[21] Appl. No.: 08/891,422

[22] Filed: Jul. 9, 1997

[51] Int. Cl.[6] ............................................... H01L 21/3205
[52] U.S. Cl. .......................... 438/593; 438/257; 438/264
[58] Field of Search ................................... 438/593, 257, 438/258, 259, 260, 261, 262, 263, 264, 265, 266, 267

[56] References Cited

U.S. PATENT DOCUMENTS 5,480,820  1/1996  Roth et al. ............................... 438/257
5,674,768  10/1997 Chang et al. ............................. 438/264

*Primary Examiner*—John F. Niebling
*Assistant Examiner*—Lynne A. Gurley
*Attorney, Agent, or Firm*—Sawyer & Associates

[57] ABSTRACT

The present invention provides a method of making a semiconductor device with a channel length of approximately 0.05 microns. A method of producing a semiconductor device according to the present invention includes a control gate, a first floating gate located in proximity to the control gate, and a second floating gate located in proximity to the control gate. The present invention allows the threshold voltage of the device to be adjusted to various levels. Additionally, the device according to the present invention can be used as a very effective nonvolatile memory device.

7 Claims, 11 Drawing Sheets

METHOD OF MAKING A SEMICONDUCTOR DEVICE WITH ADJUSTABLE THRESHOLD VOLTAGE

CROSS REFERENCE TO RELATED APPLICATIONS

This application is related to U.S. Ser. No. 08/890,104 (C403297), entitled "Short Channel Transistor Having Resistive Gate Extensions" and U.S. Ser. No. 08/890,388 (C284197), entitled "Adaptively Controlled, Self-Aligned, Short Channel Device and Method for Manufacturing Same" both assigned to the same assignee as the instant application. Both of these applications are herein incorporated by reference.

FIELD OF THE INVENTION

The present invention relates generally to semiconductor devices, and more particularly, to a device with multiple floating gates which can serve as a memory cell with multiple floating gates in which the threshold voltage is adjustable.

BACKGROUND OF THE INVENTION

There is a trend in the semiconductor industry to reduce the geometry of semiconductor devices to thereby increase the number of such devices available in a given area. This reduction of the geometry of the semiconductor device results in increased density of an integrated circuit (IC) chip. As the integration degree of semiconductor devices becomes high, the device size must be gradually reduced. The increased density of semiconductor devices in a given area of an IC chip results in an increased performance by the IC chip, including faster operating speeds and power consumption necessary to supply the IC chip.

The size of a semiconductor device is in large part dependent on the critical length of a "channel" in a semiconductor device. A "channel" is a thin region of the device that supports conduction. Channel lengths have continuously shrunk to the submicron range. State of the art channel lengths range from approximately 0.18 $\mu$m to 0.25 $\mu$m.

If a semiconductor device below 0.1 micron size is manufactured, there may be a need to use multiple threshold voltages. For instance, random logic may be located on the same chip as the memory when using semiconductor devices below 0.1 micron size. The random logic may require a low threshold voltage while the memory may require a higher threshold voltage. Conventionally, it is typically very difficult to manufacture a single IC chip which allows the use of multiple threshold voltages. Many additional masking steps would be required to produce such an IC chip in the conventional manner.

Accordingly, what is needed is a device which is smaller than the conventionally sized semiconductor devices which can allow the threshold voltages to be adjusted, and a method for producing such a device. The present invention addresses such a need.

SUMMARY OF THE INVENTION

The present invention provides a semiconductor device which can serve as a memory cell in which the threshold voltage is adjustable. Additionally, the semiconductor device according to the present invention has a channel length below approximately 0.1 microns, and preferably approximately 0.05 microns. A semiconductor device according to the present invention, and a method for producing such a semiconductor device, comprises a control gate, a first floating gate located in proximity to the control gate, and a second floating gate located in proximity to the control gate. The present invention allows the threshold voltage of the device to be adjusted to various levels. Additionally, the device according to the present invention can be used as a very effective nonvolatile memory device.

DESCRIPTION OF THE INVENTION

The present invention relates to a semiconductor device in which the threshold voltage is adjustable. Additionally, the semiconductor device according to the present invention is smaller than the conventional semiconductor device. The present invention is also related to a method for producing such a semiconductor device. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1A:
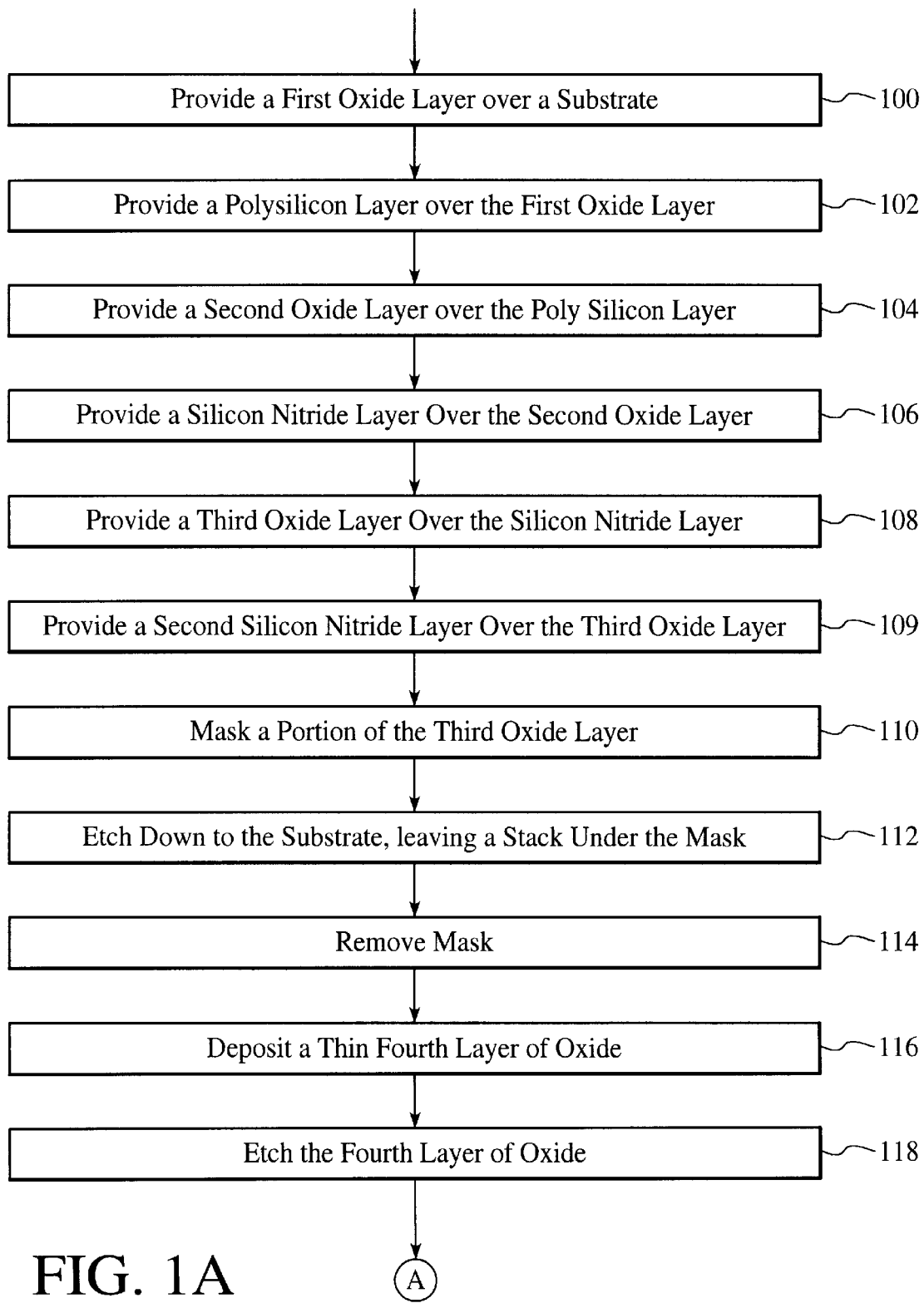
FIGS. 1a–1c show a flow diagram of a method for producing a semiconductor device according to the present invention.
Figure 1B:
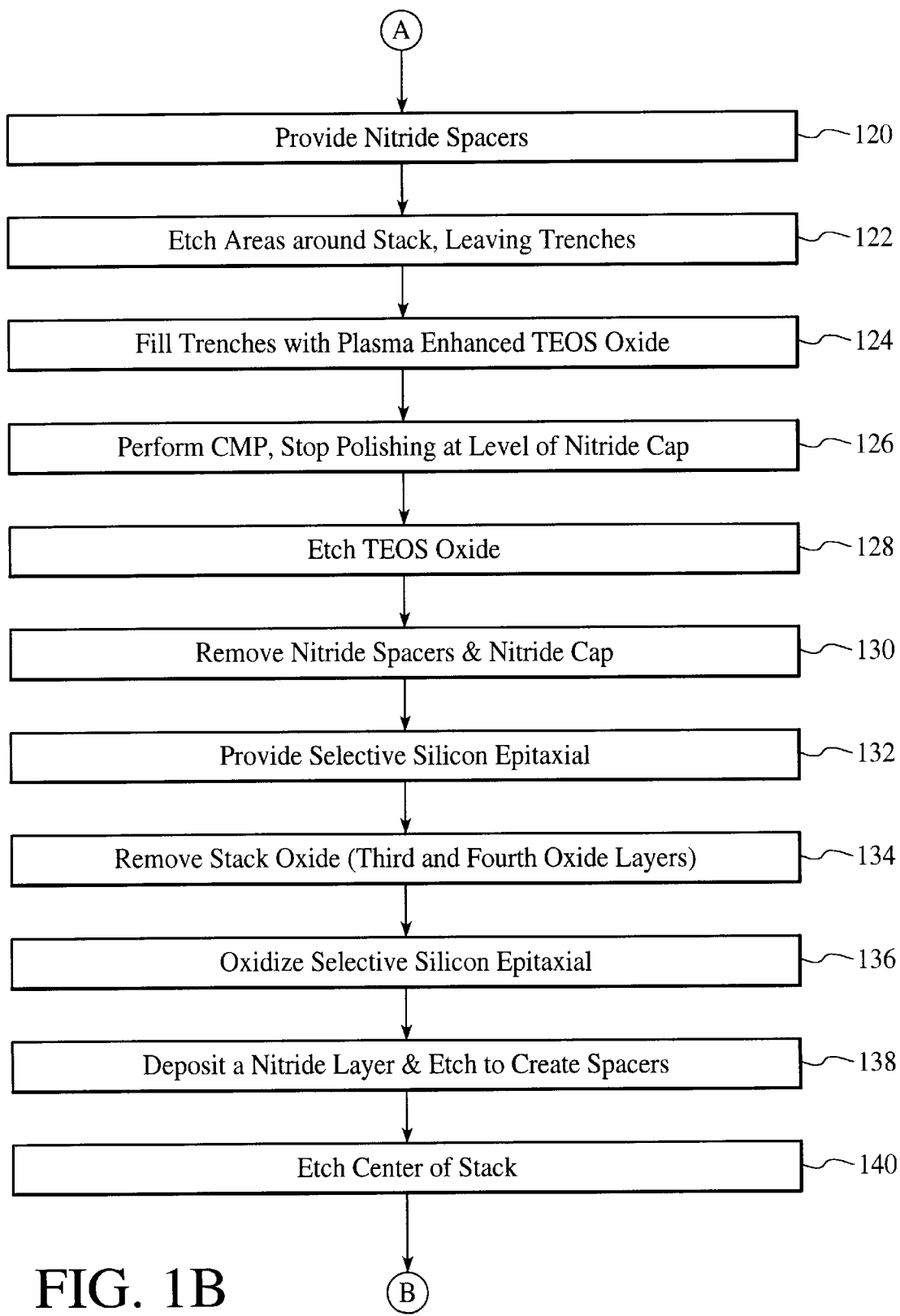
Figure 1C:
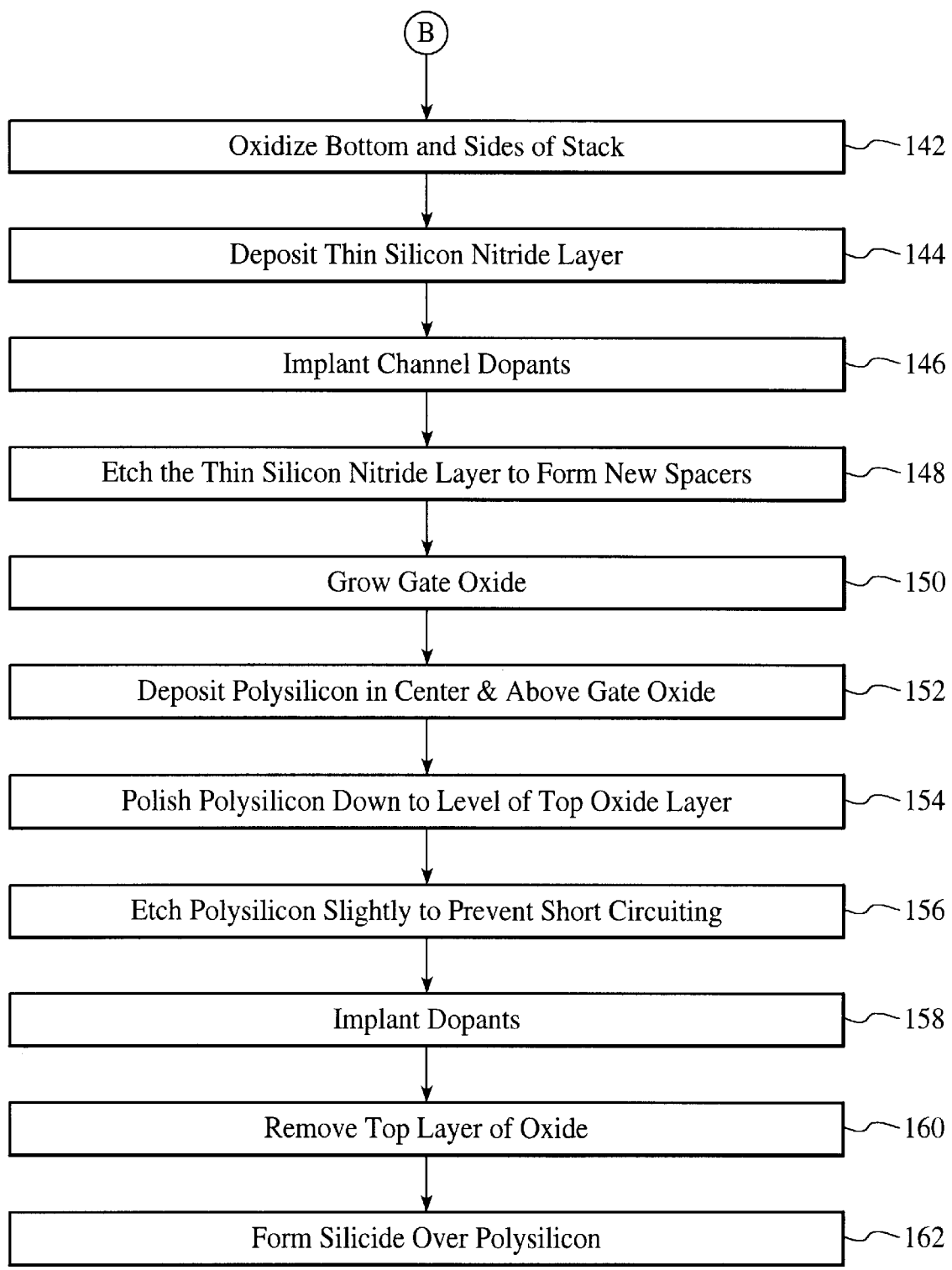

FIGS. 1a–1c show a flow diagram of a method for providing a semiconductor device according to the present invention. FIGS. 1a–1c can be viewed along with FIGS. 2a–2h which illustrate the method shown in FIGS. 1a–1c. A first oxide layer 202 of FIG. 2 is provided over a substrate via step 100. The first oxide layer 202 has a preferred thickness of approximately 6–10 nm. A polysilicon layer 204 is then provided over the first oxide layer 202 via step 102. The polysilicon layer 204 has a preferred thickness of approximately 25–40 nm. A second oxide layer 206 is then provided over the polysilicon layer 204 via step 104, wherein the second oxide layer 206 has a preferred thickness of approximately 8–12 nm. A silicon nitride layer 208 is then provided over the second oxide layer 206 via step 106. The silicon nitride layer 208 has a preferred thickness of approximately 12–16 nm. A third oxide layer 210 is then provided over the silicon nitride layer 208 via step 108, wherein the third oxide layer 210 has a preferred thickness of approximately 0.3–0.5 $\mu$m. A second silicon nitride layer 220 is then provided over the third oxide layer 210. The second nitride layer 220 will hereinafter be referred to as a nitride cap 220. The nitride cap 220 has a preferred thickness of 0.15–0.25 $\mu$m.

A portion of the third oxide layer 210 is then masked with photoresist material 212 via step 110. An etch is performed down to the substrate 200, leaving a stack under the mask via step 112. The mask is then removed via step 114. A thin fourth layer of oxide 214, approximately 100 Angstroms to 200 Angstroms thick, is then deposited via step 116. The fourth layer of oxide 214 is then etched via step 118, leaving a thin oxide spacer layer 214' with a preferred thickness of approximately 0.01 µm to 0.02 µm. Nitride spacers 218 are then provided via step 120. The nitride spacers 218 have a preferred thickness of approximately 0.08 to 0.15 µm. Areas around the stack are then etched, leaving trenches 224 of FIG. 2d, via step 122. The trenches 224 are formed into the substrate 200 to isolate the semiconductor device. The trenches 224 are preferably etched into the substrate to a depth 223 of 0.21 µm to 0.4 µm deep from the surface of the substrate 200. These trenches 224 are filled preferably with plasma enhanced Tetra Ethyl Ortho Silicate (TEOS) oxide 222 via step 124. The TEOS oxide 222 has a preferred thickness of approximately 1.5 to 2 microns. Chemical mechanical polishing (CMP) is then performed via step 126. The polishing is performed using one of many available conventional methods to avoid uneven surfaces. The polishing is preferably stopped at the level of the nitride cap 220. The TEOS oxide 222 is then etched via step 128.

The nitride spacers 218 and the nitride cap 220 is then removed via step 130. A selective silicon epitaxial layer 230 of FIG. 2e is then provided via step 132. The stack oxide (third and fourth oxide layers 214' and 210) are then removed via step 134. The selected silicon epitaxial layer 230 is then oxidized leaving oxide layer 232 of FIG. 2f, via step 136. The oxidized layer 232 has a preferred thickness of 0.01 to 0.03 µm. A nitride layer is then deposited and etched to create new spacers 234 of FIG. 2g, via step 138. The new spacers 234 preferably have a thickness of 25–50 nm. The center of the stack is then etched via step 140.

The bottom and sides of the stack are then oxidized via step 142, and a thin silicon nitride layer is then deposited via step 144. Channel dopants 246a–246b of FIG. 2h are implanted via step 146. Channel dopant 246 is preferably very shallow, while channel dopant 246b is slightly deeper, such as 100 to 200 nm deep from the surface of the substrate 200. The thin silicon nitride layer and the oxidation are etched to form new spacers 248 and 250, via step 148. Gate oxide 252 is then grown via step 150. The gate oxide 252 preferably has dimensions of 0.0015 µm to 0.003 µm. Polysilicon 242 is then deposited in the center and above the gate oxide 252 via step 152. The polysilicon 242 preferably has a thickness of approximately 200–400 nm.

The polysilicon 242 is then polished down to the level of the top oxide layer 232' via step 154. The polysilicon 242 is then slightly etched to prevent shortcircuiting via step 156. The polysilicon 242 is etched back preferably approximately 50–100 nm. Dopants 244 are then implanted via step 158. The dopants 244 are preferably N-type ions used to form source and drain dopant regions 244.

The top layer of oxide 232' is then removed via step 160, and silicide 240 is formed over the polysilicon 242 via step 162. The silicide 240 is preferably used as an interconnect layer. Thereafter, standard conventional semiconductor processing steps are performed via step 164 to complete the semiconductor device.

FIGS. 2a–2h illustrate the fabrication of the semiconductor device according to the present invention. FIGS. 2a–2h illustrate the method according to the present invention shown in FIGS. 1a–1c.

Figure 2A:
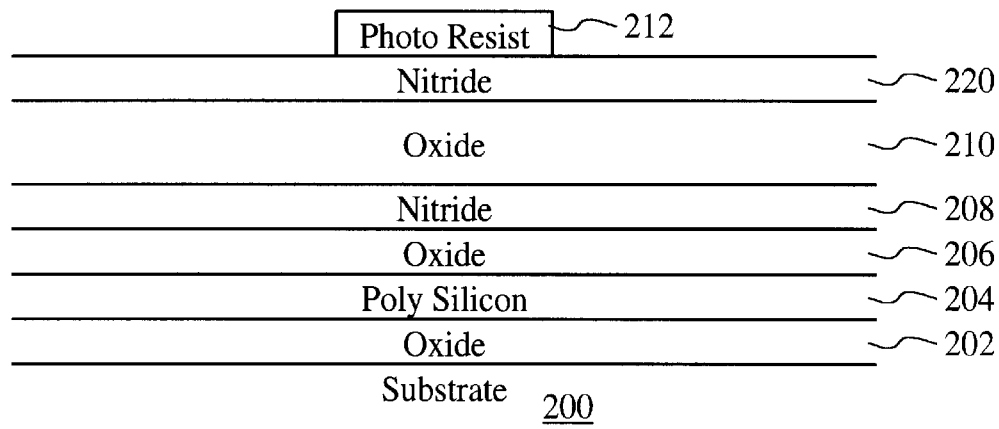
FIGS. 2a–2h illustrate various stages of the production of the semiconductor device according to the method shown in FIGS. 1a–1c.

FIG. 2a shows the semiconductor device after steps 100–110 of FIG. 1a have been performed. FIG. 2a shows the substrate 200 with a layer of oxide 202 above it. Additionally, a layer of polysilicon 204, a second layer of oxide 206, a layer of nitride 208, and a third layer of oxide 210 is shown above the first layer of oxide 202. A second nitride layer 220 is shown above the third layer of oxide 210. A photoresist material 212 is shown to cover a portion of the third layer of oxide 210.

Figure 2B:
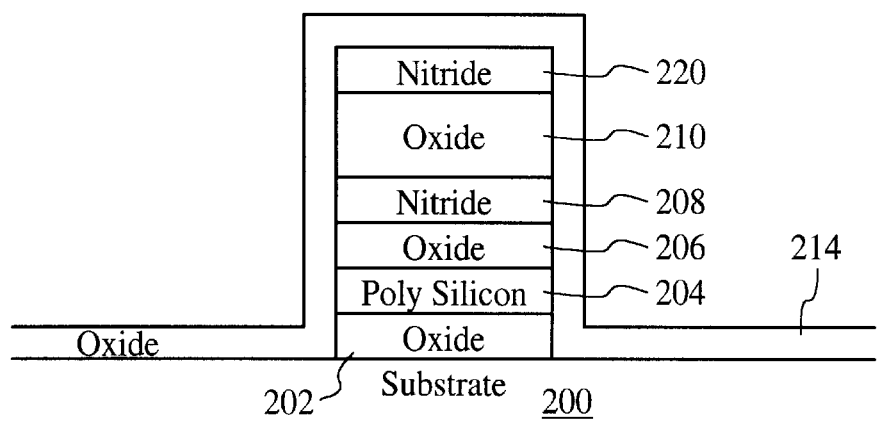

FIG. 2b shows the semiconductor device after steps 112–116 of FIG. 1a have been performed. The various layers have been etched to the substrate, leaving a stack. The photoresist mask has been removed and a thin fourth layer of oxide 214 has been deposited. The fourth layer of oxide 214 preferably has a thickness of approximately 10 to 20 nm.

Figure 2C:
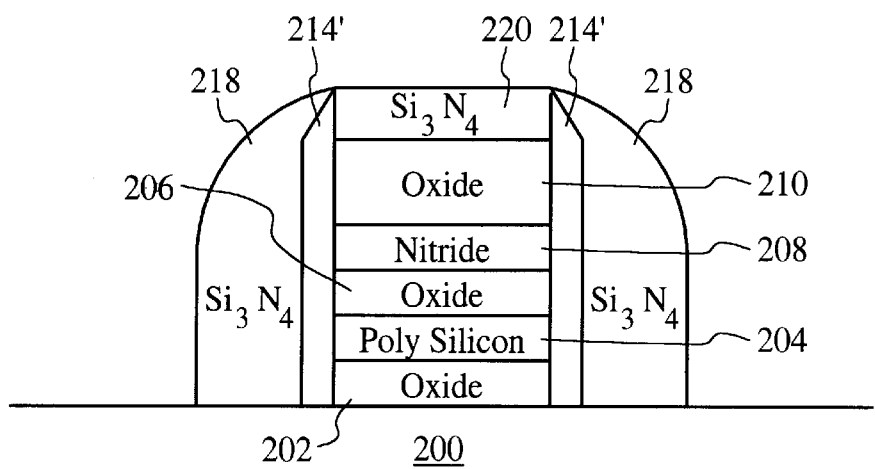
Figure 2D:
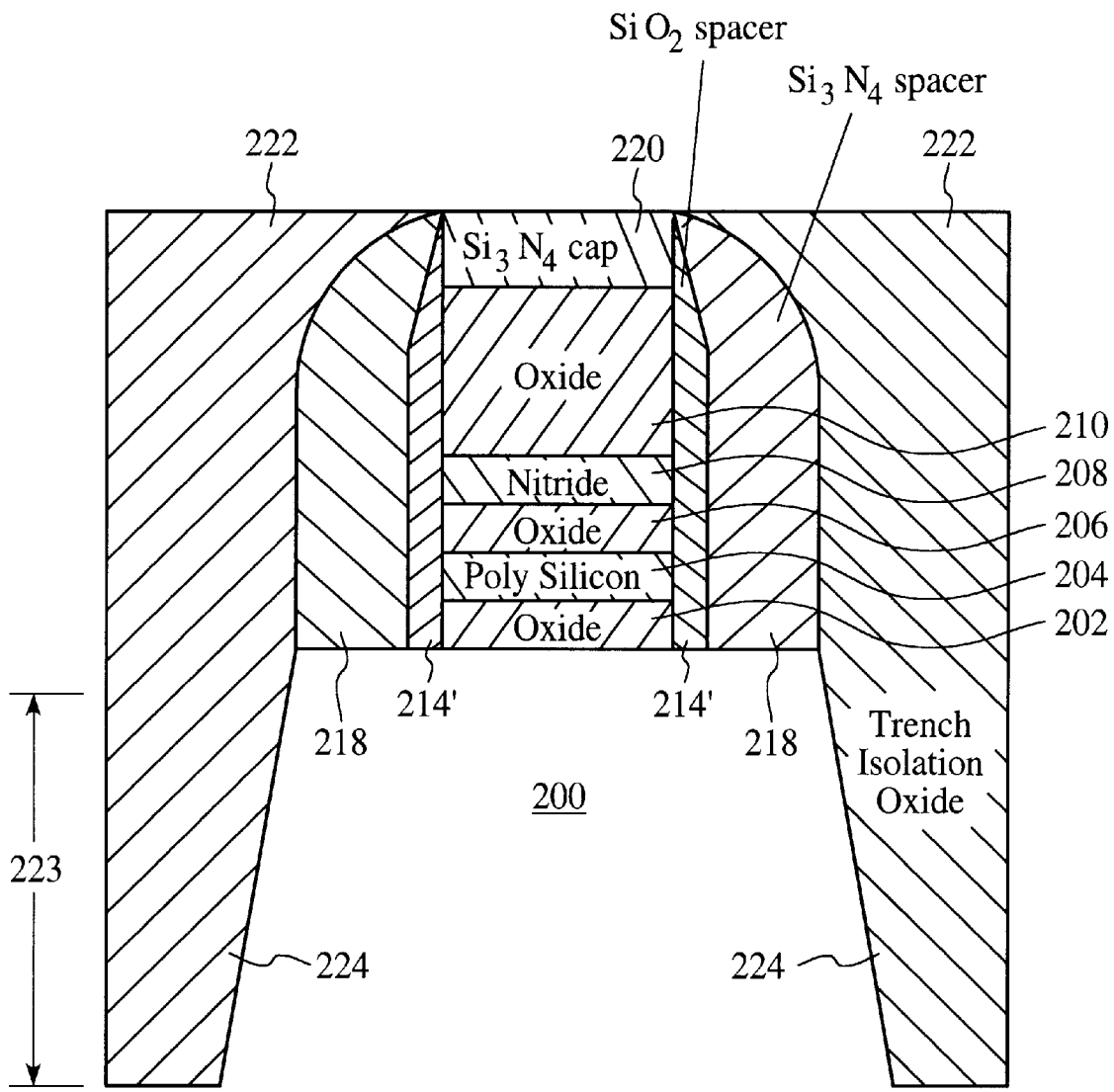
Figure 2E:
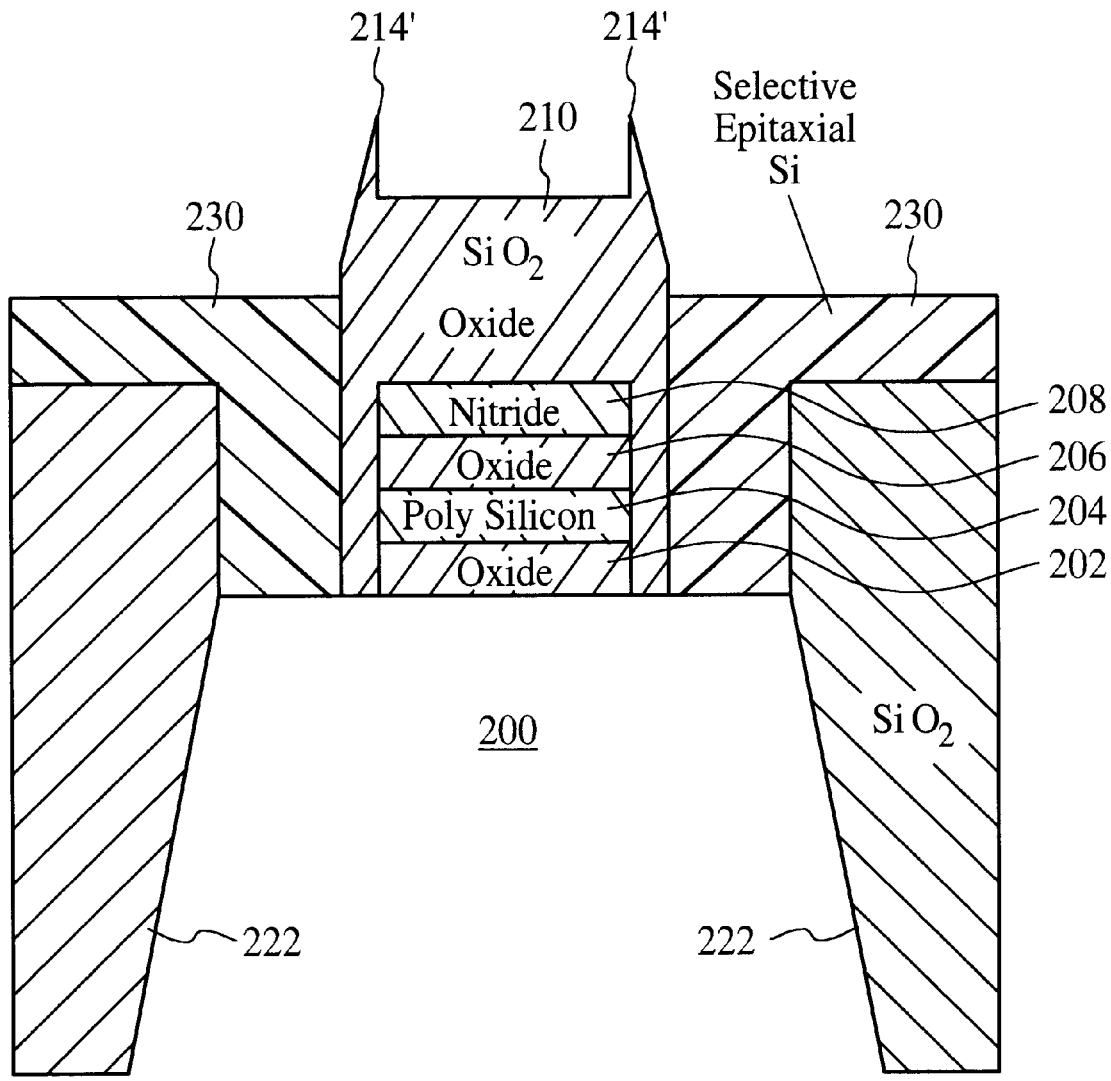

FIG. 2c shows the semiconductor device after steps 118–120 of FIGS. 1a and 1b have been performed. The fourth layer of oxide 214 has been etched to leave the oxide strips 214'. Additionally, nitride spacers 218 have been provided. FIG. 2d shows the semiconductor device after steps 122–126 of FIG. 1b have been performed. Areas around the stack have been etched, leaving trenches 224. These trenches 224 have been filled with plasma enhanced TEOS oxide 222. A chemical-mechanical polishing has been performed with the polishing being stopped at the level of the nitride cap 220.

FIG. 2e shows the semiconductor device after steps 128–132 of FIG. 1b have been performed. The TEOS oxide 222 of FIG. 2d has been etched, and the nitride spacers 218 and nitride cap 220 as shown in FIG. 2d have been removed. FIG. 2e shows that a selective silicon epitaxial layer 230 has been provided.

Figure 2F:
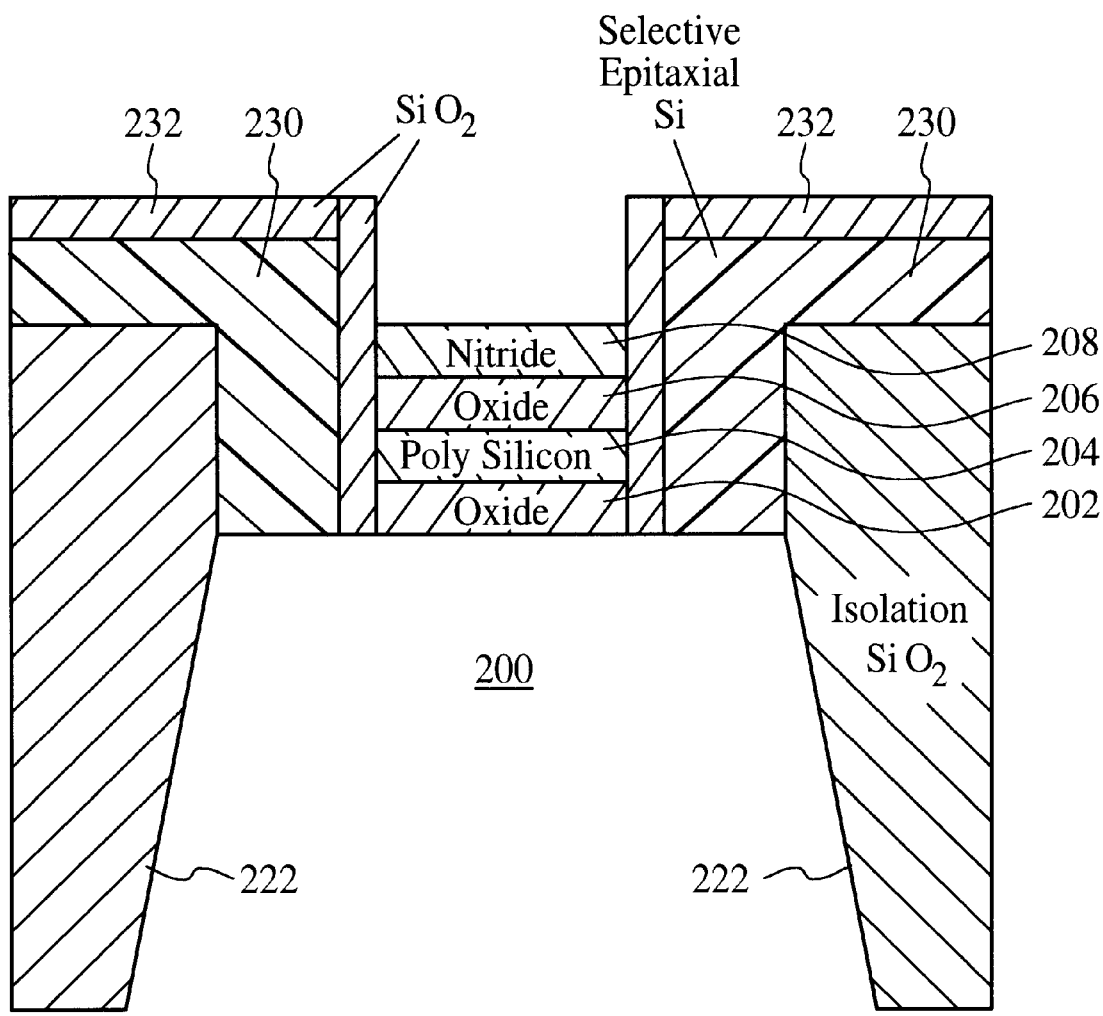

FIG. 2f shows the semiconductor device after steps 134–136 of FIG. 1b have been executed. The stack oxide, i.e., oxide layers 210 and 214' of FIG. 2e, have been removed. The selective silicon epitaxial layer 230 has been oxidized to provide an oxide layer 232 as shown in FIG. 2f.

Figure 2G:
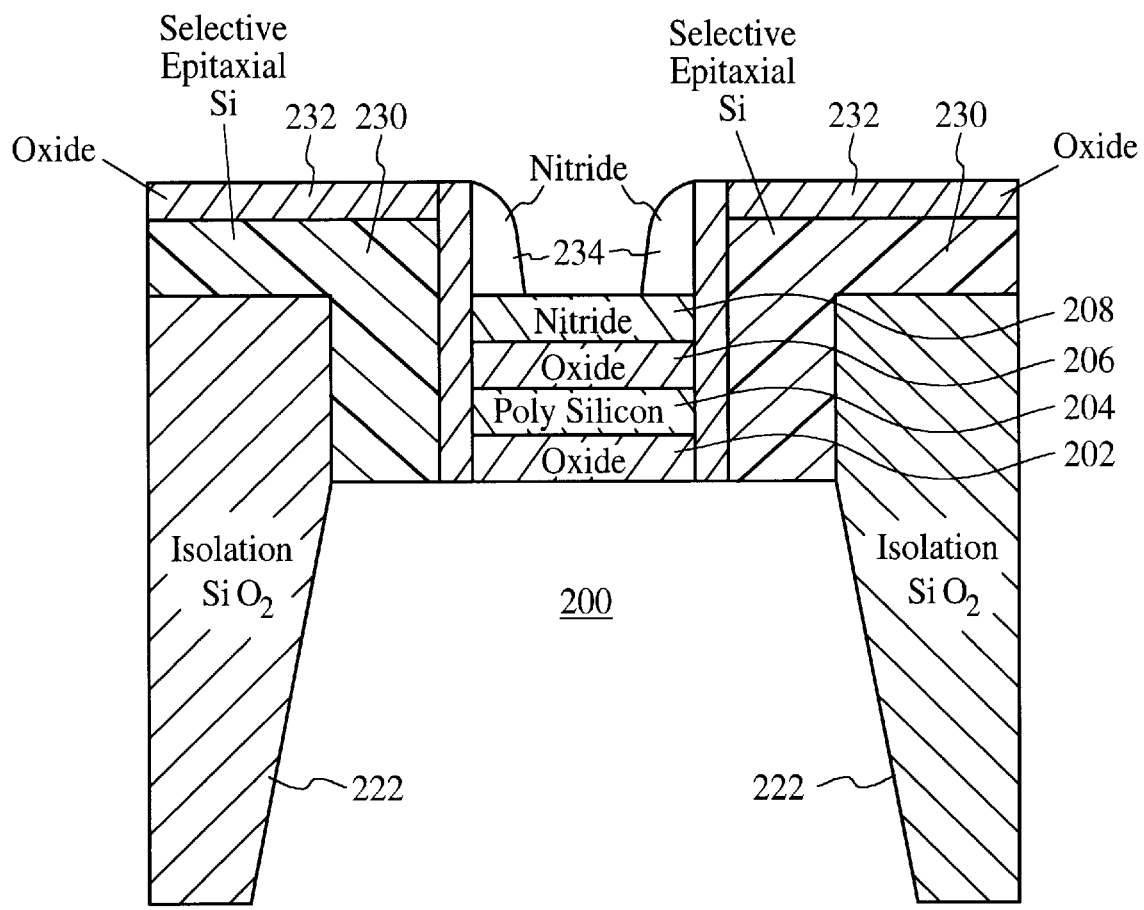
Figure 2H:
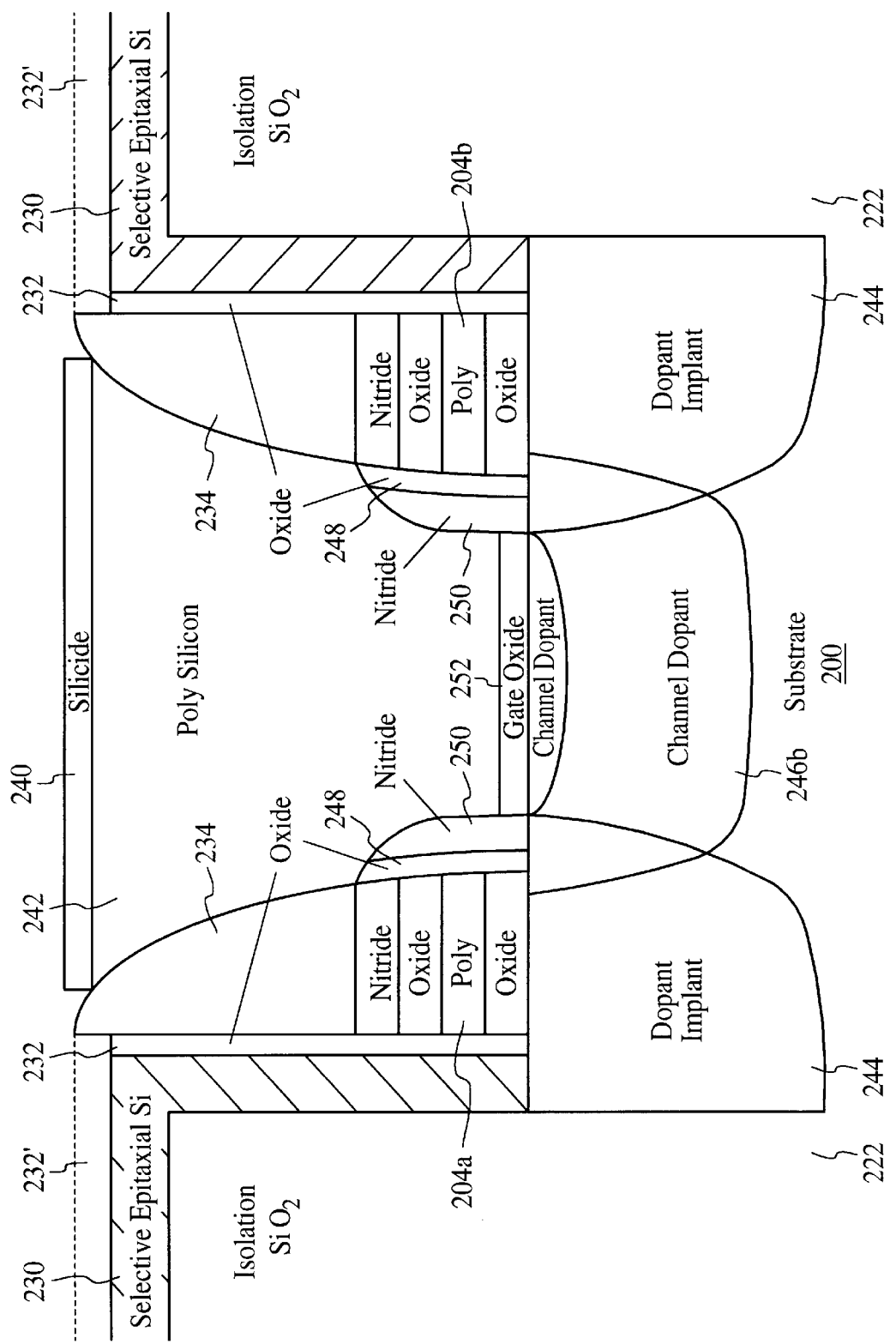

FIG. 2g shows the semiconductor device after step 138 of FIG. 1b has been completed. A nitride layer has been deposited and etched to create spacers 234.

FIG. 2h shows the semiconductor device after steps 140–162 of FIGS. 1b and 1c have been completed. FIG. 2h shows that the center of the stack has been etched, leaving the various layers of the stack located under the nitride spacers 234. The bottom and sides of the stack have been oxidized to leave the oxide layer 248. A thin nitride layer has been deposited and etched to form new spacers 250. Channel dopants 246a and 246b have been implanted. Additionally, the gate oxide 252 has been grown, and polysilicon 242 has been deposited in the center and above the gate oxide. The polysilicon 242 has been polished down to the level of the top oxide layer 232'. The polysilicon was then slightly etched to prevent short-circuiting. Dopant has been implanted into areas 244. The top layer of oxide 232' has been removed, and silicide 240 has been formed over the polysilicon 242.

Thereafter, standard conventional semiconductor processing steps are performed to complete the semiconductor device.

Figure 3:
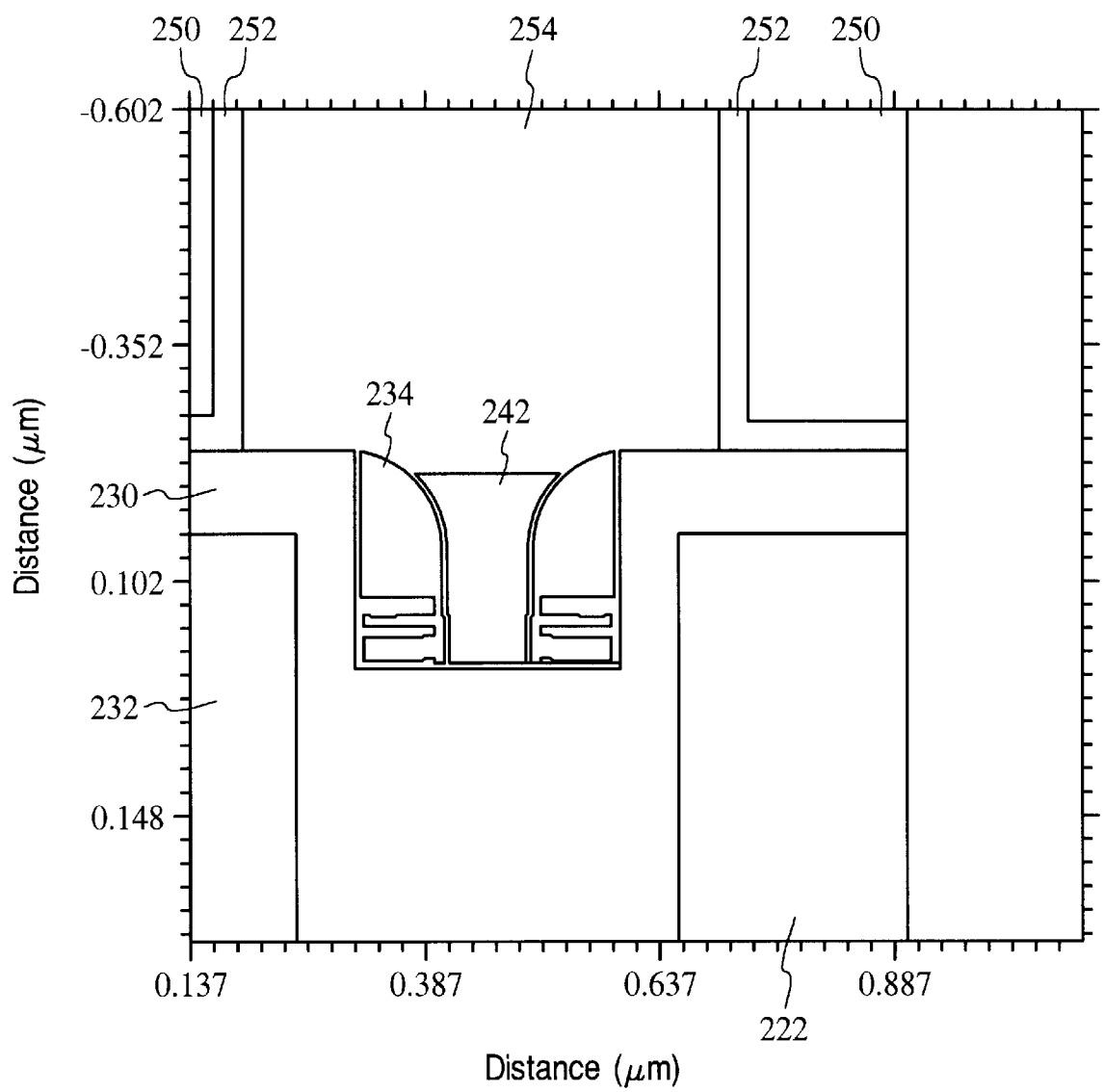
FIG. 3 shows approximate preferred distances of the semiconductor device according to the present invention.

FIG. 3 shows approximate preferred dimensions of the semiconductor device according to the present invention. FIG. 3 shows the semiconductor device of FIG. 2h after standard conventional processing steps have been performed to complete the semiconductor device. Metal 250 such as tungsten, aluminum, or copper has been placed next to titanium 252. Oxide has also been placed between the titanium 252 strips and above the polysilicon 242.

Figure 4:
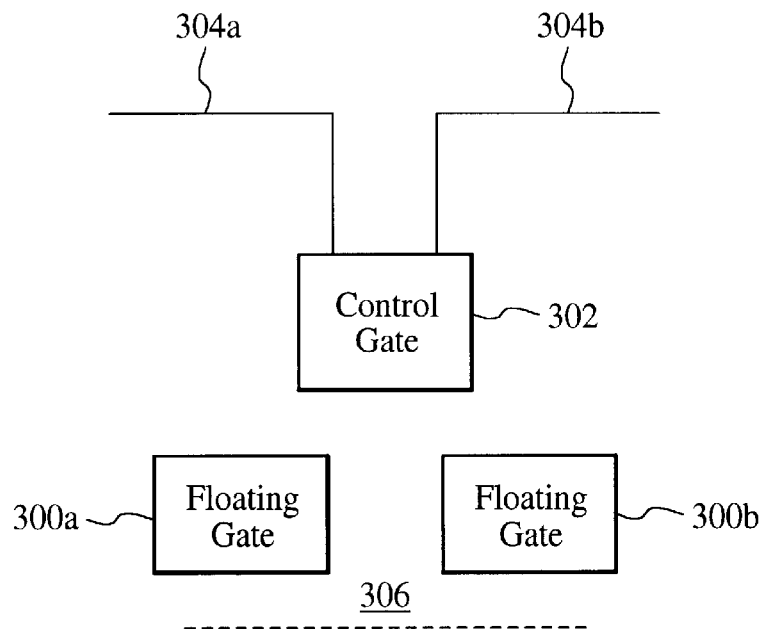
FIG. 4 is a block diagram of a semiconductor device according to the present invention.

FIG. 4 shows a semiconductor device according to the present invention. The block diagram of the semiconductor device as shown in FIG. 4 shows a control gate 302, a first floating gate 300a, and a second floating gate 300b. The control gate 302 corresponds to the polysilicon 242 area shown in FIG. 2h. Likewise, the floating gate 300a corresponds to the polysilicon area 204a shown in FIG. 2h, while the floating gate 300b corresponds to the polysilicon area 204b shown in FIG. 2h. Electrodes 304a and 304b are shown coupled to the control gate 302.

In operation, a voltage can be applied to one of the electrodes 304, while the remaining electrode 304 can be grounded. For example, 2 volts can be applied to 304a, which in this example will be used as the drain, while electrode 304b is grounded. Additionally, 2 volts can be applied to the control gate 302. In the channel area 306, a current will flow from the direction of the grounded electrode 304b to the electrode 304a which has a voltage applied to it. There is a difference in the potentials between the floating gates 300 and the channel 306 which causes high electric fields. The electrons will tunnel into the floating gates 300a and 300b. Due to differences in electric fields near the floating gates 300a and 300b, floating gate 300a will not receive the same amount of charge as floating gate 300b. The floating gate 300 closer to the grounded electrode will attract more electrons than the floating gate further away from the grounded electrode. In this example, floating gate 300b will receive more electrons than floating gate 300a. Given enough time, the charge in floating gate 300a will approximate the charge in floating gate 300b.

Since the surface potential of floating gates 300a and 300b are directly related to the threshold voltage, changes in the surface potential will cause changes in the threshold voltage. The surface potential can be changed by controlling the floating gate 300a and 300b charges. These floating gate charges can be affected by the to amount of time the current is allowed to flow in the channel region 306.

Figure 5:
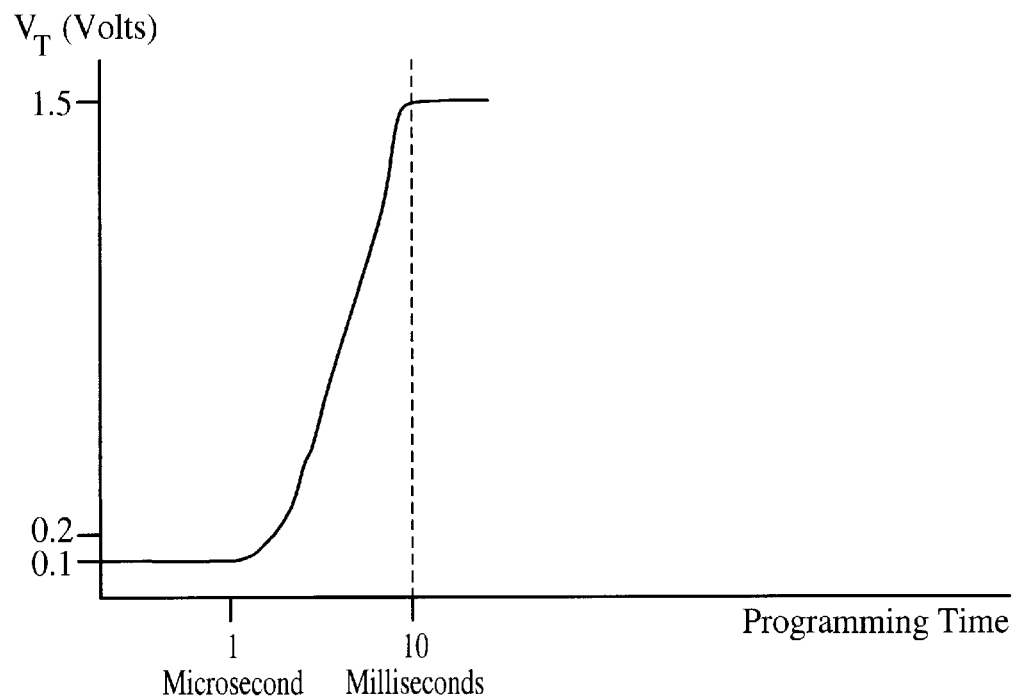
FIG. 5 is a chart showing threshold voltage vs. programming time.

An example of threshold voltage vs. time is shown in FIG. 5. Note that the graph of FIG. 5 is simply an example since actual times and threshold voltages depend upon the geometry of the particular device.

The present invention provides a semiconductor device which can serve as a memory cell in which multiple floating gates can be programmed differently based on applied biases on control gate, source and drain. Additionally, the semiconductor device according to the present invention has a channel length below approximately 0.1 microns, and preferably approximately 0.05 microns. The present invention also provides a method for producing such a semiconductor device.

Furthermore, each individual device can be programmed to have a wide variety of threshold voltages. The voltage can be set to be very low (approximately 100 mV) to maximize speed. However, some parts of integrated circuit may require a higher threshold voltage. Very low threshold voltage is typically related to a dissipation of a substantial amount of power during a device's off state as well as during switching. This dissipation of power can be highly disadvantageous for integrated circuits that are supplied by battery. A higher threshold voltage may also be needed to prevent a faulty read. This programming is orders of magnitude shorter than for non-volatile memory cells. For example, the threshold voltage programming according to the present invention can occur in approximately 10–100 ns.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method of fabricating a semiconductor device comprising:

providing a control gate;

providing a first floating gate located in proximity to the control gate; and providing a second floating gate located in proximity to the control gate;

wherein the steps of providing the first and second floating gates include substeps of:

providing a substrate;

providing a polysilicon layer proximate to the substrate;

etching a portion of the polysilicon layer to provide the first floating gate and the second floating gate.

2. The method of claim 1, wherein the step of providing the control gate includes a substep of providing a poly silicon layer proximate to the first and second floating gate area.

3. The method of claim 1, wherein a threshold voltage associated with the semiconductor device is variable.

4. The method of claim 1, wherein a threshold voltage associated with the semiconductor device can be controlled to vary in a range from a first value to a second value.

5. The method of claim 4, wherein a particular threshold voltage in the range can be achieved by applying a control voltage to the semiconductor device for a particular time.

6. The method of claim 1, wherein the semiconductor device includes a channel area having a length no greater than approximately 0.1 $\mu$m.

7. The method of claim 1, further comprising a channel area having a length of approximately 0.05 $\mu$m.

* * * * *